US008389999B2

(12) United States Patent
Buonassisi et al.

(10) Patent No.: US 8,389,999 B2
(45) Date of Patent: Mar. 5, 2013

(54) METHOD TO REDUCE DISLOCATION DENSITY IN SILICON USING STRESS

(75) Inventors: Anthony Buonassisi, Cambridge, MA (US); Mariana Bertoni, Somerville, MA (US); Ali Argon, Belmont, MA (US); Sergio Castellanos, Sonora (MX); Alexandria Fecych, Somerville, MA (US); Douglas Powell, Highland Heights, OH (US); Michelle Vogl, Dekalb, IL (US)

(73) Assignee: Massachusetts Institute of Technology, Cambridge, MA (US)

( * ) Notice: Subject to any disclaimer, the term of this patent is extended or adjusted under 35 U.S.C. 154(b) by 226 days.

(21) Appl. No.: 12/892,370

(22) Filed: Sep. 28, 2010

(65) Prior Publication Data

US 2011/0073869 A1     Mar. 31, 2011

Related U.S. Application Data

(60) Provisional application No. 61/246,294, filed on Sep. 28, 2009.

(51) Int. Cl.
*H01L 29/04* (2006.01)
(52) U.S. Cl. ................. 257/75; 257/52; 257/59; 257/72; 438/57; 438/58; 438/97
(58) Field of Classification Search ........................ None
See application file for complete search history.

(56) References Cited

U.S. PATENT DOCUMENTS

| | | | |
|---|---|---|---|
| 3,441,385 A | 4/1969 | Schmidt | |
| 4,632,712 A | 12/1986 | Fan et al. | |
| 6,635,110 B1 | 10/2003 | Luan et al. | |
| 2008/0164570 A1 | 7/2008 | Kouvetakis et al. | |
| 2009/0184382 A1* | 7/2009 | Hartman et al. ............... | 257/431 |

FOREIGN PATENT DOCUMENTS

| | | |
|---|---|---|
| EP | 0407233 | 1/1991 |
| KR | 100246874 | 3/2000 |
| WO | 0101465 | 1/2001 |

OTHER PUBLICATIONS

Luan et al., "high-quality Ge epilayers on Si with low threading-dislocation densities" Applied Physics Letters, vol. 75, No. 19, pp. 2909-2911, Nov. 8, 1999.
International Search Report and Written Opinion issued in connection with corresponding PCT Application No. PCT/US2010/050522, mailed on Jun. 8, 2011.

* cited by examiner

*Primary Examiner* — Kyoung Lee
(74) *Attorney, Agent, or Firm* — Gesmer Updegrove LLP (57) ABSTRACT

A crystalline material structure with reduced dislocation density and method of producing same is provided. The crystalline material structure is annealed at temperatures above the brittle-to-ductile transition temperature of the crystalline material structure. One or more stress elements are formed on the crystalline material structure so as to annihilate dislocations or to move them into less harmful locations.

40 Claims, 11 Drawing Sheets

METHOD TO REDUCE DISLOCATION DENSITY IN SILICON USING STRESS

PRIORITY INFORMATION

This application claims priority from provisional application Ser. No. 61/246,294 filed Sep. 28, 2009, which is incorporated herein by reference in its entireties.

SPONSORSHIP INFORMATION

This invention was made with Government support under Grant No. DE-FG36-09GO19001, awarded by the Department of Energy. The Government has certain rights in this invention.

BACKGROUND OF THE INVENTION

The invention is related to the field of semiconductor fabrication and processing, and in particular to a technique to reduce dislocations in silicon wafers during growth of semiconductor materials, or during the processing of existing semiconductor materials.

Over 50% of solar cells produced today are manufactured from multicrystalline silicon (mc-Si) wafers. The electrical properties of the solar cell devices that are manufactured on mc-Si wafer substrates are extremely sensitive to the density of defects present in these materials. Defects inside the solar cell wafers, commonly referred to as "bulk defects" (e.g., impurities and structural defects), are particularly deleterious for solar cell efficiencies. The most damaging bulk defects are those that are most uniformly distributed, such as one-dimensional structural defects known as dislocations.

By decreasing the dislocation density of the multicrystalline silicon material without compromising bulk impurity concentrations, efficiency improvements of 10-40% relative may be achieved. Thus, the quality of multicrystalline silicon can be boosted to levels comparable to monocrystalline silicon, while retaining the cost advantage of multicrystalline silicon. This would enable multicrystalline silicon substrates, with minority carrier lifetimes approaching those of float zone material, to be incorporated into higher-efficiency device architectures.

SUMMARY OF THE INVENTION

According to one aspect of the invention, a method of reducing dislocation density in a crystalline material structure is provided. The method includes annealing the crystalline material structure at temperatures above the brittle-to-ductile transition temperature of the crystalline material. Also, the method includes forming one or more stress states on the crystalline material structure during annealing, so as to annihilate dislocations or to move them into less harmful locations.

According to another aspect of the invention, there is provided a crystalline material structure with reduced dislocation density. The crystalline material structure includes a crystalline material structure being annealed at temperatures above the brittle-to-ductile transition temperature of the crystalline material structure. One or more stress states are formed on the crystalline material structure so as to annihilate dislocations or to move them into less harmful locations (e.g., out of intragranular regions, to grain boundaries, select regions of a larger sample, or out of the material altogether).

DETAILED DESCRIPTION OF THE INVENTION

The invention provides a technique to reduce dislocation densities in crystalline materials. A crystalline material is one that has a regularly repeating pattern of atoms or molecules (commonly defined in solid state physics as the same grouping of atoms or molecules (the "basis") around each lattice point). One such example of a crystalline material is crystalline silicon, a solid material with a diamond cubic structure. The physical size and shape of said crystalline materials can in principle be any form, for instance, a wafer, a ribbon, or a block. This invention incorporates three elements to significantly reduce the dislocation density:

The first element is using very-high-temperature annealing to eliminate dislocations. One temperature meriting definition is the "brittle-to-ductile transition temperature", the temperature at which brittle crystalline solids become ductile, i.e., the temperature above which dislocations become mobile within the material. The brittle-to-ductile transition temperature is typically around 0.8 times the melting temperature (in kelvin) of most crystalline solids. Once dislocations are mobile within the material, several pathways for dislocation annihilation are possible, e.g., pairwise annihilation or out-diffusion. Such is the case for steels and other metals. In silicon, three temperatures to date are attempted: 1366° C., 1233° C., and 1100° C. Samples annealed at 1366° C. exhibited a noticeable decrease in dislocation density, samples annealed at 1233° C. exhibited an intermediate decrease in dislocation density, while samples annealed at 1100° C. did not exhibit a large dislocation density reduction, even at extended annealing times. One can suspect there can be a shorter time and lower temperature at which dislocation densities can be appreciably reduced. As this is a kinetic process, there exists an inherent tradeoff between time and temperature, e.g., lower temperature anneals appear to require longer annealing times to achieve the same reduction in dislocation density. Because of this trade-off, it should be possible to achieve a substantial dislocation density reduction within a reasonable amount of time, by annealing within a well-specified and limited range of annealing times and temperatures.

The second element is the formation of a diffusion barrier to slow the entry of harmful impurities. A diffusion barrier is formed on the silicon wafer or ingot surface before annealing, and is generally removed after annealing. Note that a diffusion barrier is optional when using a block-like structure, as the outer material itself may act as an impurity diffusion barrier for slowly-diffusing impurities. The diffusion barrier is formed of an inert substance that is appreciably thick, to slow the indiffusion of deleterious metallic impurities (e.g., Ti and Al), and can be easily removed after annealing. Silicon nitride, which etches away in HF, is one such candidate material.

The third element is controlled cool to room temperature. It is believed that the preferred time-temperature profile during cooling to room temperature should be kept as linear as possible, and the temperature throughout the material be kept as uniform as possible, to avoid thermal stresses that may cause new dislocations to form. Satisfying these two criteria sets an estimate for the maximum cooling rate. It is believed to be important to maintain a linear time-temperature profile and uniform temperature throughout the material down to the $T_0$ transition temperature, defined herein as the temperature at which thermally activated dislocation motion is severely inhibited. For many crystalline materials, $T_0$ is typically given as the brittle-to-ductile transition temperature. However, for crystalline materials wherein dislocation kink formation energies are large (hence dislocation glide is strongly preferred along certain crystallographic planes), such as crystalline silicon, $T_0$ (~1100° C.) is actually several hundreds of degrees higher than the commonly-accepted brittle-to-ductile transition temperature (~550° C.).

In one embodiment, for instance in a block-like geometry, one could envision elements one and three might be sufficient to reduce dislocation densities in multicrystalline silicon. In another embodiment, for instance a thin wafer, one could envision elements one, two, and three may be used in combination.

Figure 1:
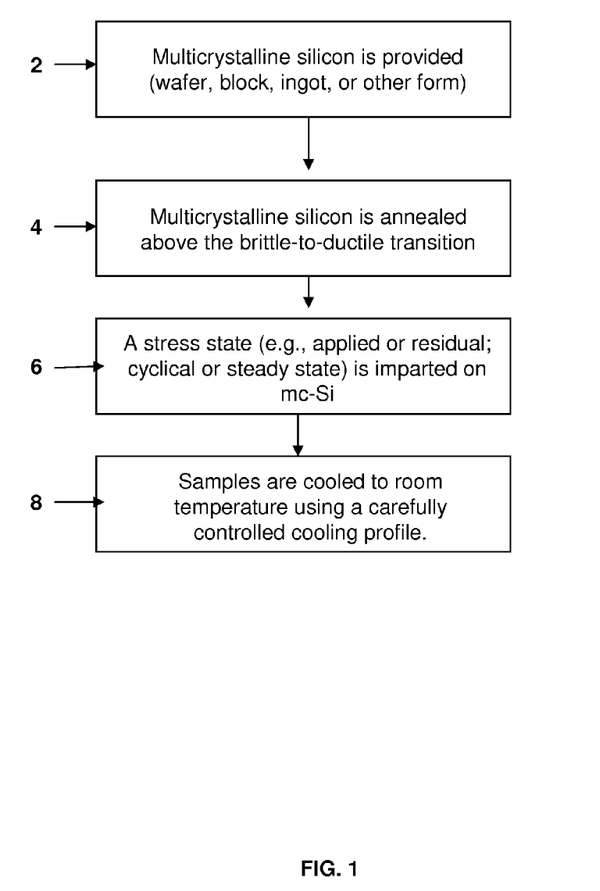
FIG. 1 is a flowchart illustrating one embodiment of the steps used in performing the inventive technique.

FIG. 1 is a flowchart illustrating the inventive technique of reducing dislocations in accordance with the invention. Multicrystalline silicon wafers, block, ingots, or silicon structures having thicknesses ~200±20 µm thick are provided, as shown in step 2.

Annealing was performed in a tube furnace for 6 hours. Three annealing temperatures were used: 1366, 1233° C., and 1100° C., as shown in step 4. An S-type thermocouple was used to measure temperature. One or more stress states (e.g., applied or residual; cyclical or steady state) are imparted on mc-Si, as shown in step 6. Samples are slowly cooled to room temperature over the duration of three hours, as shown in step 8, employing as linear a time-temperature profile as the power supply could enable. Samples were removed from the furnace at room temperature.

Figure 2A:
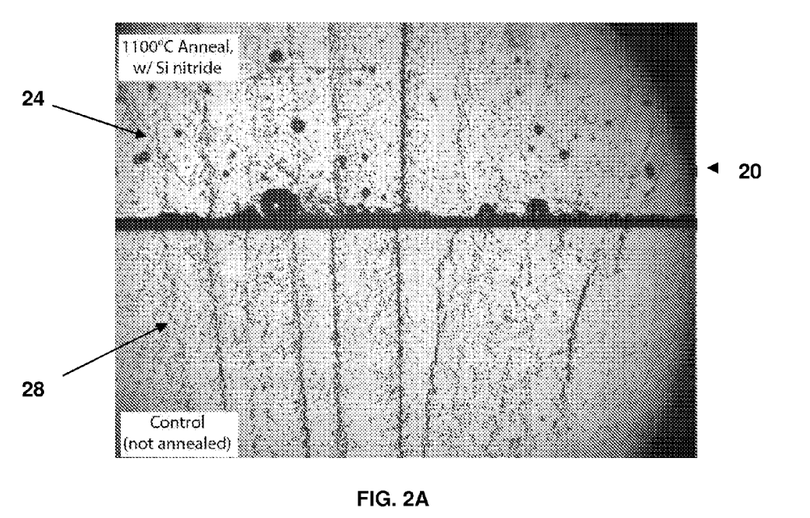
FIGS. 2A-2B are dislocation density images illustrating the removal of dislocation in a multicrystalline Si structure.
Figure 2B:
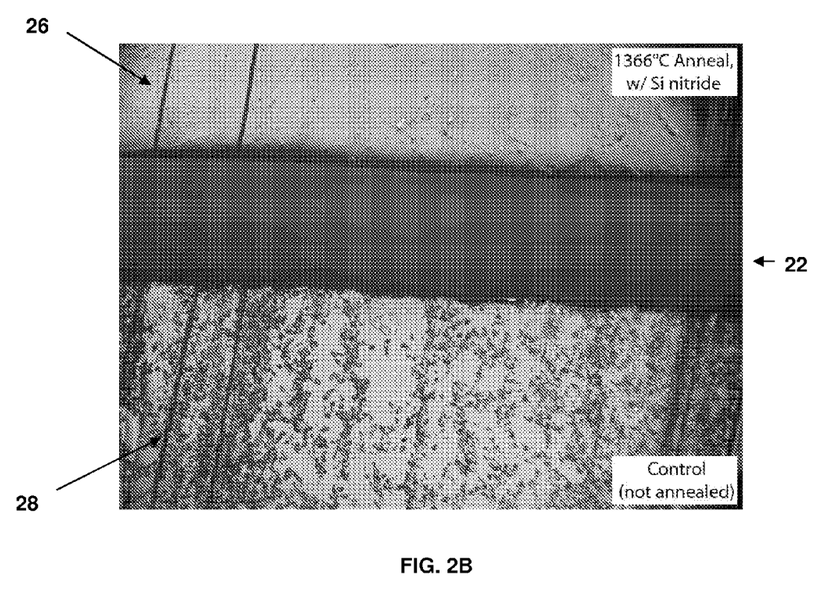

Dislocation density imaging is performed using an optical microscope. The two pieces 20, 22 of the same wafer (annealed and control) are placed face-to-face, to illustrate the change in dislocation density. Typical images for 1100° C. and 1366° C. anneals are shown in FIG. 2A-2B respectively. Dislocation etch pits appear as dark spots in this bright-field optical microscope image. The upper samples 24, 26 are the annealed; the lower 28 the control. Both annealed samples 24, 26 (1100° C. and 1366° C.) are double-sided coated with silicon nitride before annealing; this coating was etched off before defect etching and there is a clear showing of lower dislocation density in samples 26.

There is currently no established technique to reduce bulk dislocation densities in crystalline silicon materials after crystal growth, and current methods to reduce pre-existing dislocations during crystal growth are insufficient. A fixed-temperature, post-solidification high-temperature anneal is generally employed during crystal growth of silicon for solar cell applications, but dislocation densities remain high nevertheless, possibly due to new dislocation formation fueled by thermal gradients within the ingot.

As discussed earlier, a striking dislocation reduction upon applying our invention was shown. Samples annealed for 6 hours at 1366° C. present a reduction in dislocations of the order of 95% as well as some migration of the linear features.

Figure 3:
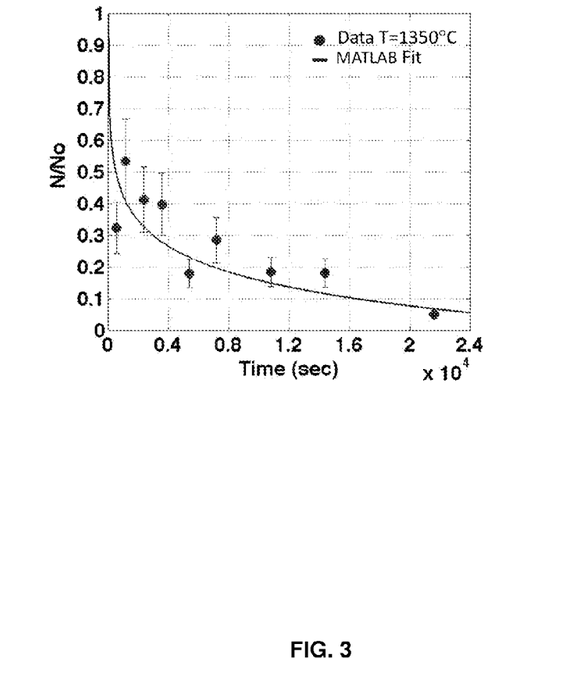
FIG. 3 is a graph illustrating dislocation density evolution.

The invention can be extended to elaborate on the time dependency of the dislocation annihilation at a given temperature. FIG. 3 suggest that the majority of dislocation density reduction occurs in the first 60 minutes of the anneal, and subsequently the dislocation density reaches a plateau.

The fit used in FIG. 3 comes from a non-linear expression that contemplates forces between dislocations (on the order of GbN/L, where b is the Burgers vector, G is the shear modulus and L is the length of each slip line) and proposes a dislocation annihilation following the rate equation $$\frac{dN}{dt} = -K \cdot \exp - \frac{Q - \beta GN/L}{k_B T}, \quad [1]$$

where K and β are constants, Q is the activation energy.

In order to extract the activation energy from experimental data using equation 1, the dislocation density reduction versus time was plotted for a constant annealing temperature (1350° C.) and fitted using a nonlinear code in MATLAB. Several iterations of the fitting routine were undertaken until a minimum value for the reduced chi-square was obtained. The resulting fit indicated an activation energy of 2.1±0.2 eV with a reduced chi-square value of 2.03, when assuming a 25% error in the original data. This activation energy lies within the range of values for the glide of 60° dislocations in silicon (2.0–2.3 eV) and the kink migration energy (2.1±0.3 eV) calculated using first principle electronic structure methods.

The fact that the activation energy for dislocation motion during the high temperature annealing is similar to the activation energy that has been reported previously for dislocation motion in silicon suggests that the annihilation of dislocations is enhanced by a mechanism that does not affect the intrinsic value of the activation energy.

Figure 4:
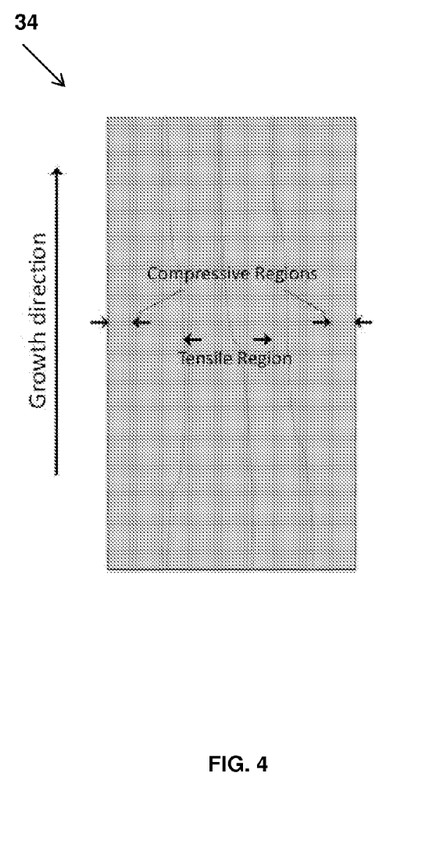
FIG. 4 is a schematic diagram illustrating mc-Si ribbon growth and distribution of stresses.

During the growth of multicrystalline silicon the material is exposed to high thermal gradients, which not only promotes in many cases dislocation formation but also results in residual stresses that can potentially lead to mechanical failure. For the particular case of ribbon silicon, the wafer 34 has an inherent tensile region in the middle and compressive region at the edges, as shown in FIG. 4.

Figure 5:
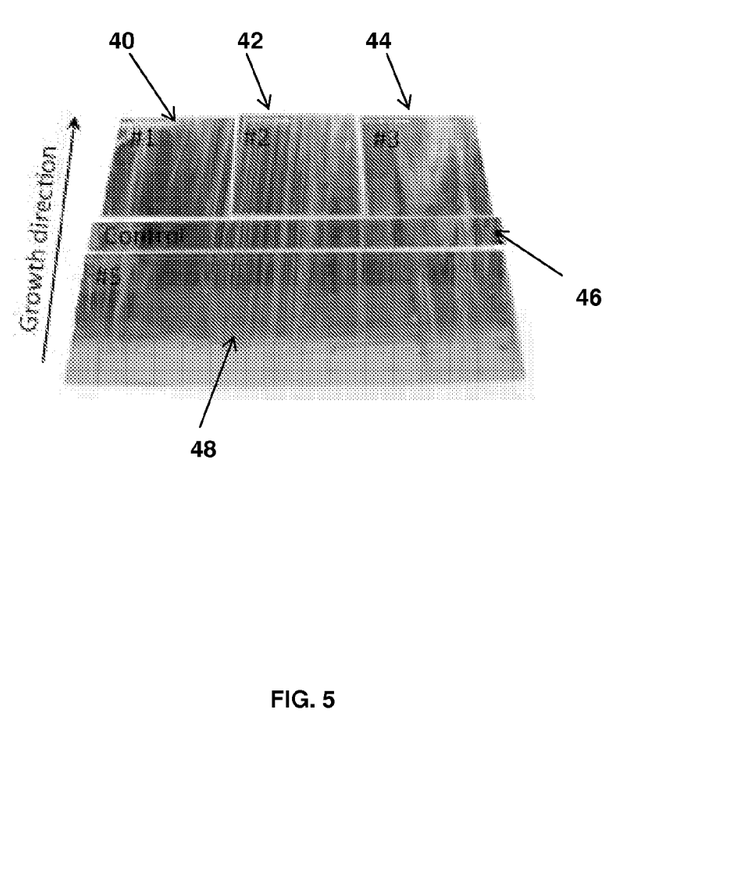
FIG. 5 is a microscope image illustrating a cut used in accordance with the invention.

In order to test the importance of the residual stress distribution in the wafers, a set of samples are prepared as shown in FIG. 5. Three 1"×1" laser-cut adjacent specimens 40, 42, 44 are provided. Note that cutting the ribbon into smaller specimens 40, 42, 44 reduces the residual stress, as stress must go to zero at a free surface. These three specimens 40, 42, 44 can be thought of as "low-residual stress" states. One ¼" thick long stripe covering the entire length of the wafer kept as the control sample 46. One 1" thick and wafer-long sample 48 is provided. As this sample 48 includes larger residual stresses than the specimens 40, 42, 44, this sample 48 is referred as "high residual stress".

Figure 6:
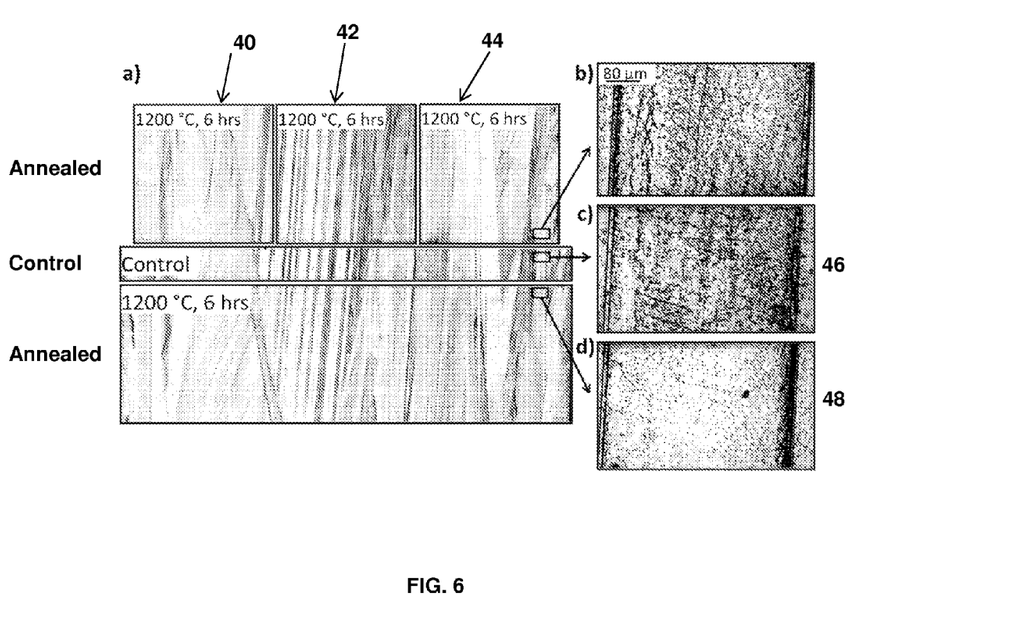
FIG. 6 is a microscope image illustrating samples with different cuts after annealing.

The three cleaved specimens 40, 42, 44, the control sample 46, and the 1" wafer-long specimen 48 were annealed together at 1200° C. for 6 hours following the procedure described herein, as shown in FIG. 6. After annealing, the 1" wafer-long specimen 48 presents a higher dislocation reduction than the 1"×1" cut counterparts 40, 42, 44. It is believed the higher residual stress in specimen 48 is responsible for this effect.

Figure 7A:
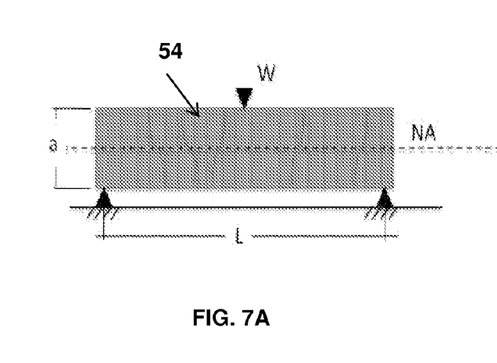
FIG. 7A is a schematic diagram illustrating a three point bending fixture.
Figure 7B:
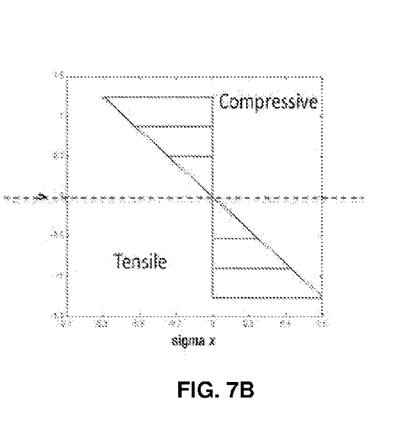
FIG. 7B is a graph illustrating the distribution of stresses during three-point bending.

After the first set of promising results, a wafer-long sample 54 is placed in a three point bending fixture, as shown in FIG. 7A. The fixture created a clear distribution of stresses (compressive and tensile) inside the material with magnitudes on the same order as the stresses normally found in the material, as shown in FIG. 7B.

Figure 8A:
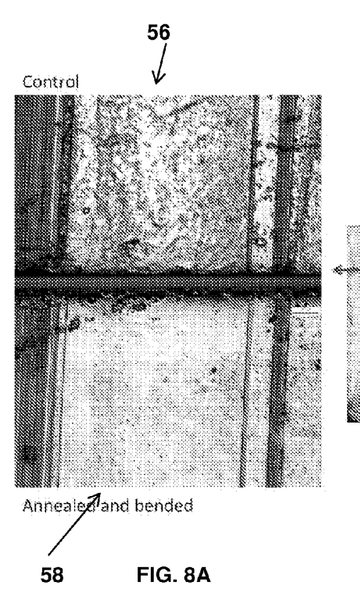
FIGS. 8A-8C illustrate results of the 3-point bending test while annealing.
Figures 8B, 8C:
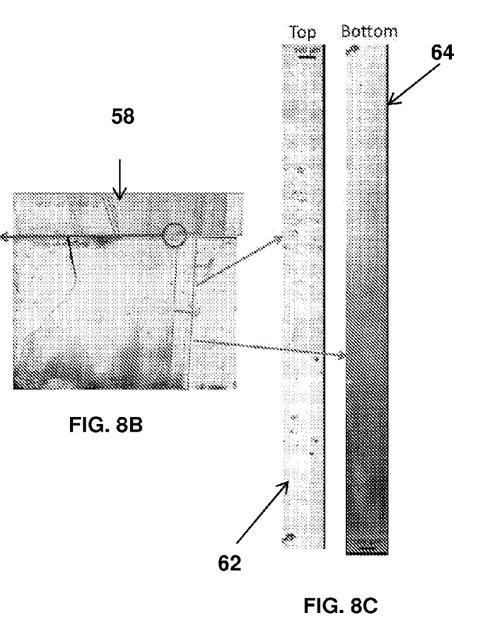

The hypothesis to be tested by the three point bending setup is: can intentionally-applied stress affect the distribution and density of dislocations? The results of this experiment clearly confirm this hypothesis. FIG. 8A shows a detailed illustration at a region where a control sample 56 and a high residual stress specimen 58 are formed and FIG. 8B shows a detail microscope image of the high residual stress specimen 58 illustrating compressive stress regions 62 and tensile stress regions 64. FIG. 8C demonstrates that the compressive stress regions 62 exhibit almost a 100% reduction in dislocation density and the tensile stress regions 64 exhibit a considerable increase in the density of dislocations. Moreover, grain boundaries tend to also disappear in compressive regions 62; these may be low-angle grain boundaries, which are essentially rows of tightly packed dislocations. This experiment confirms that intentionally applied stress can lead to a local reduction in dislocation density or move them into less harmful locations.

For a typical ingot (20 cm tall, 1250 cm$^2$ in cross sectional area) or brick (20 cm tall, 250 cm$^2$ in cross sectional area), forces of 2500 kN and 500 kN, respectively, are required to generate a stress of 20 MPa. While annealing can certainly be done as a separate step after crystal growth, either at the ingot, sub-ingot, brick, sub-brick, ribbon, wafer, or other wafer precursor scale, solutions (i.e., embodiments) that combine high-temperature processes, i.e., crystal growth and dislocation annealing, are especially of interest. Crystal growth is performed under high temperatures. For instance, possibilities include: taking advantage of high temperatures of crystal growth by applying stress at high temperatures during crystal growth, applying stress at high temperatures by geometrically confining (constraining) the crystal or partially solidified material, or taking advantage of coefficient of thermal expansion (CTE) mismatches between materials (e.g., silicon and surrounding crucible material) during heating. Constraining the material upon reheating, this gives rise to a CTE-driven stress between the material and its encasement. Applying a load or making contact with the silicon at room temperature and heating up, using a material with greater CTE than silicon. The material encasing the silicon at room temperature is heated (heating from the outside in). Engineering and taking advantage of residual stresses in the material.

Loads or reaction forces (at constraining surfaces) can be applied in one direction, or in more than one direction, on the silicon. Both stress and stress gradient can play a role in dislocation motion. Hydrogen can play a role in enhancing dislocation motion, especially at lower temperatures. An additional source of H could be considered, e.g., remote plasma, to enhance dislocation motion. Annihilation can occur pair-wise, or dislocations can diffuse to (and incorporate themselves into) the nearest grain boundary or surface.

One can inject native point defects, which can assist with dislocation motion and possibly annihilation. Some methods of injecting native point defects include: addition/precipitation of substitutional defects; surface layers that absorb Si; tensile stresses (surface and bulk); implantation of fast-diffusing element; and rapid quenching.

The invention can be useful for manipulating or removing other structural defects besides dislocations (e.g., small-angle grain boundaries). Also, the invention can be used in other materials beyond silicon. The usable temperature range for this process is extremely wide, which should be beneficial to solar cell processing. It should be possible to perform this process at temperatures up to the melting temperature of silicon, or at temperatures down to the brittle-to-ductile transition temperature as well as perhaps lower, depending on the pressure applied and strain rate.

Note normal stresses can also be used in the invention to annihilate dislocations as described above.

An alternative method to applying mechanical stress is to apply thermal stress. High temperature cycling can be used to form cyclic stresses associated with small thermal gradients across the material. Non-linear thermal gradients may be applied to create shear stress via uneven thermal expansion. Repeated application of these shear stresses can aid dislocation motion and annihilation throughout the material.

Evidence has shown that cyclic stress is most effective at higher temperatures, although presumably this technology can be combined with others (previous inventions/disclosures from our research group) to lower the processing temperature. These processing conditions allow dislocations to move freely through the material, further enhancing their annihilation. Cyclic stress can also be applied mechanically, through heat, through photons, or the like. The key here is the cyclic nature of the applied stress.

There are at least three possible embodiments for applying the thermal gradients: the sample could be placed in an environment where the temperature can fluctuate; for example, a temperature-programmable furnace; the sample could moved between environments of different set temperatures; for example, translation of the sample through a furnace's heat zone(s), where temperatures can be measured as distinctly different in different locations; and a combination of the aforementioned techniques.

Figure 9:
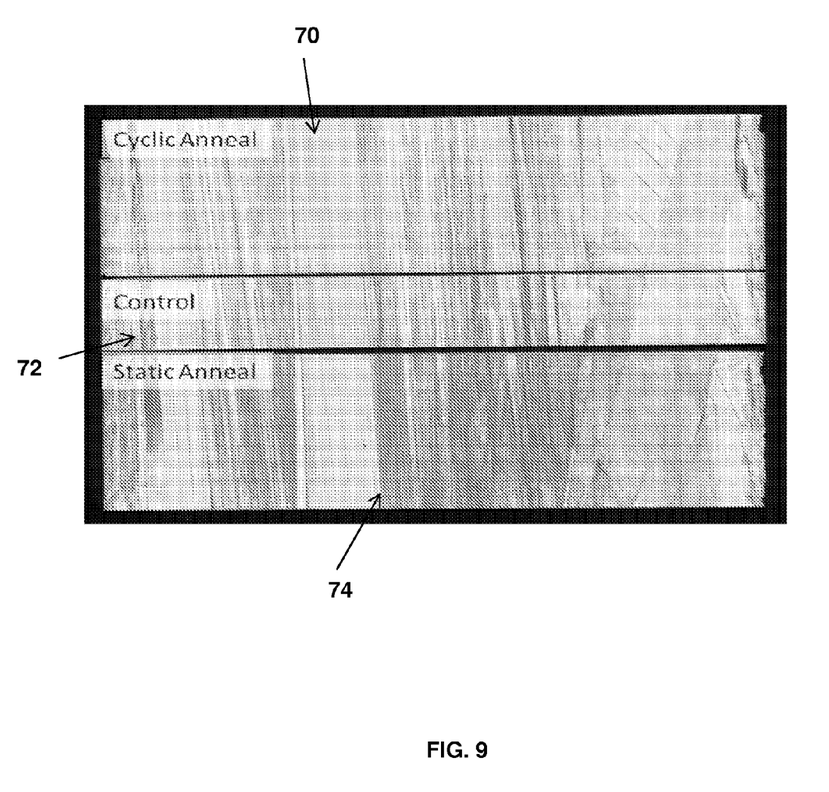
FIG. 9 is a microscope image illustrating the configuration of cyclically annealed, statically annealed, and control samples used in accordance with the invention.
Figure 10:
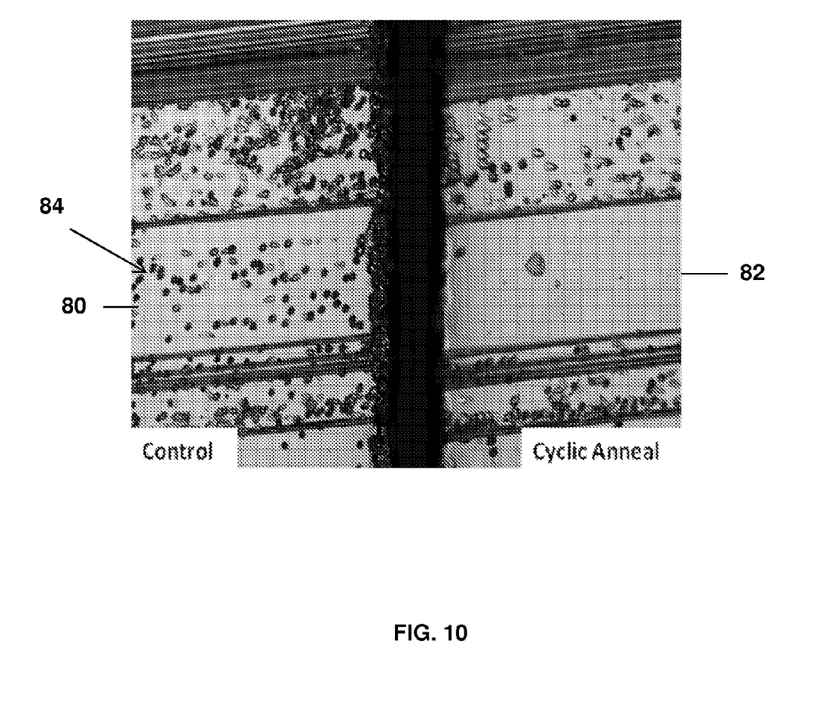
FIG. 10 is a microscope image illustrating a cyclically annealed sample compared to the control sample.
Figure 11:
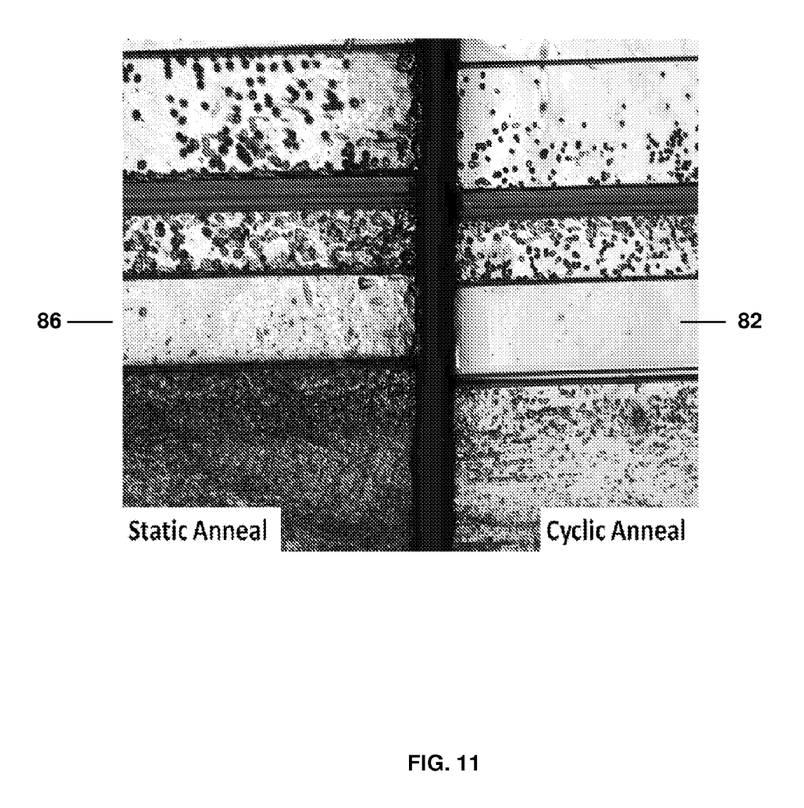
FIG. 11 is a microscope image illustrating a cyclically annealed sample compared to a sample annealed at a constant temperature equal to the max temperature of the cyclically annealed sample.

Preliminary tests show the potential of the method. Two wafers of ribbon silicon 70, 74, separated by a thin control sample 72 as seen in FIG. 9, were annealed under cyclic and static conditions, respectively. The maximum temperature of the cyclically annealed temperature was equal to the temperature of the statically annealed sample. Adjacent sections 80, 82 of the same grains are compared below. The black etch pits 84 are dislocations (i.e., whiter areas in these images denote lower dislocation densities). The cyclically annealed sample 82 shows a clear reduction from the control as shown in FIG. 10, and also from the statically annealed sample 86 as shown in FIG. 11.

Although the present invention has been shown and described with respect to several preferred embodiments thereof, various changes, omissions and additions to the form and detail thereof, may be made therein, without departing from the spirit and scope of the invention.

What is claimed is:

1. A method of reducing dislocation density in a crystalline material structure, comprising:
   annealing said crystalline material structure at temperatures above the brittle-to-ductile transition temperature of said crystalline material; and
   forming one or more stress states en said crystalline material structure so as to annihilate dislocations or to move them into less harmful locations.

2. The method of claim 1, wherein the crystalline material comprises a semiconductor.

3. The method of claim 2, wherein the semiconductor crystalline material comprises silicon.

4. The method of claim 3, wherein the crystalline silicon material comprises multicrystalline silicon.

5. The method of claim 1, wherein the crystalline material is a wafer, ribbon, block, or ingot.

6. The method of claim 1, wherein the one or more stress states comprise mechanical stresses.

7. The method of claim 1, wherein the stresses comprise normal stresses.

8. The method of claim 1, wherein the stresses comprise compressive stresses.

9. The method of claim 1, wherein the stresses comprise shear stresses.

10. The method of claim 1, wherein the stresses comprise a normal stress gradient.

11. The method of claim 1, wherein the stresses comprise a shear stress gradient.

12. The method of claim 1, wherein the stresses are applied with physical contact.

13. The method of claim 1, wherein the stress are applied without physical contact.

14. The method of claim 1, wherein the one or more stress states comprise residual stresses.

15. The method of claim 1, wherein the one or more stress states comprise cyclic stresses.

16. The method of claim 1, wherein the cyclic stresses comprises non-linear thermal gradients to create stress via uneven thermal expansion.

17. The method of claim 16, wherein the non-linear stress gradients are formed thermally or mechanically or through photons.

18. The method of claim 16, wherein the cyclic stresses comprise a sample being placed in an environment where temperature fluctuates.

19. The method of claim 16, wherein the cyclic stresses comprise exposing a sample being moved between environments of different set temperatures.

20. The method of claim 1, wherein said crystalline material is utilized in a solar cell.

21. A semiconductor structure with reduced dislocation density comprising:
a crystalline material structure being annealed at temperatures above the brittle-to-ductile transition temperature of said crystalline material structure, and
one or more stress states formed on said crystalline material structure so as to annihilate dislocations or to move them into less harmful locations.

22. The semiconductor structure of claim 21, wherein the crystalline material comprises a semiconductor.

23. The semiconductor structure of claim 22, wherein the semiconductor crystalline material comprises silicon.

24. The semiconductor structure of claim 23, wherein the semiconductor silicon material comprises multicrystalline silicon.

25. The semiconductor structure of claim 21, wherein the crystalline material is a wafer, ribbon, block or ingot.

26. The semiconductor structure of claim 21, wherein the one or more stress elements comprise mechanical stresses.

27. The semiconductor structure of claim 21, wherein the stresses comprise normal stresses.

28. The semiconductor structure of claim 21, wherein the stresses comprise compressive stresses.

29. The semiconductor structure of claim 21, wherein the stresses comprise shear stresses.

30. The semiconductor structure of claim 21, wherein the stresses comprise a normal stress gradient.

31. The semiconductor structure of claim 21, wherein the stresses comprise a shear stress gradient.

32. The semiconductor structure of claim 21, wherein the stresses are applied with physical contact.

33. The semiconductor structure of claim 21, where in the stress are applied without physical contact.

34. The semiconductor structure of claim 21, wherein the one or more stress states comprise residual stresses.

35. The semiconductor structure of claim 21, wherein the one or more stress states comprise cyclic stresses.

36. The semiconductor structure of claim 21, wherein the cyclic stresses comprises non-linear thermal gradients to create shear stress via uneven thermal expansion.

37. The semiconductor structure of claim 36, wherein the non-linear gradients are foamed thermany or mechanically or through photons.

38. The semiconductor structure of claim 36, wherein the cyclic stresses comprises exposing a sample being placed in an environment where temperature fluctuates.

39. The semiconductor structure of claim 36, wherein the cyclic annealing comprises exposing a sample being moved between environments of different set temperatures.

40. The semiconductor structure of claim 21, wherein said crystalline material is utilized in a solar cell.

* * * * *